(12) United States Patent
Johansson

(10) Patent No.: US 6,470,472 B1
(45) Date of Patent: Oct. 22, 2002

(54) ARRANGEMENTS AND METHOD RELATING TO TRANSMISSION OF DIGITAL DATA

(75) Inventor: Magnus Johansson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/426,105

(22) Filed: Oct. 22, 1999

(30) Foreign Application Priority Data

Oct. 23, 1998 (SE) .............................................. 9803634

(51) Int. Cl.$^7$ ............................................ H03M 13/00
(52) U.S. Cl. ........................ 714/785; 714/758; 714/784
(58) Field of Search ................................ 714/758, 751, 714/797, 780, 819, 822, 785, 784

(56) References Cited

U.S. PATENT DOCUMENTS

| | | | | | |
|---|---|---|---|---|---|
| 3,732,541 A | * | 5/1973 | Neubauer | ................... | 714/800 |
| 4,215,335 A | * | 7/1980 | Doi et al. | ................... | 347/900 |
| 4,670,880 A | * | 6/1987 | Jitsukawa et al. | .......... | 714/797 |
| 4,718,066 A | * | 1/1988 | Rogard | ....................... | 714/751 |
| 4,719,642 A | | 1/1988 | Lucas | | |
| 4,759,022 A | * | 7/1988 | Akerberg | ................... | 340/7.44 |
| 5,046,069 A | | 9/1991 | Calvignac et al. | | |
| 5,216,676 A | * | 6/1993 | Kimura | ...................... | 714/782 |
| 5,406,569 A | | 4/1995 | Isozaki | | |
| 5,426,653 A | * | 6/1995 | Hayes et al. | ................. | 714/752 |
| 5,598,422 A | * | 1/1997 | Longwell et al. | ........... | 714/785 |
| 5,721,743 A | * | 2/1998 | Sharpe et al. | ................ | 714/758 |
| 5,881,069 A | * | 3/1999 | Cannon et al. | ............. | 375/130 |
| 5,995,559 A | * | 11/1999 | Hedberg | ..................... | 375/340 |
| 6,119,258 A | * | 9/2000 | Elkind | ........................ | 714/745 |
| 6,145,110 A | * | 11/2000 | Khayrallah | .................. | 714/752 |

OTHER PUBLICATIONS

Chase, D., "A Class of Algorithms for Decoding Block Codes with Channel Measurement Information" IEEE Trans. Inform. Theory, vol. IT–18, pp. 170–182, Jan. 1972.
Fahami, M., et al., "Improved Decoding of a Concatenated Code Using Soft Decoding Techniques", A Master Thesis, Dept. of Information Theory, Chalmers University of Technology, Gothenburg, Sweden, Dec. 1995.

* cited by examiner

Primary Examiner—Albert DeCady
Assistant Examiner—Joseph D. Torres
(74) Attorney, Agent, or Firm—Burns, Doane, Swecker & Mathis, L.L.P.

(57) ABSTRACT

A receiving arrangement receives digitally coded data signals transported over a channel. The data signal includes sequences divided into blocks, and the receiving arrangement includes an error correcting device providing a number of alternative blocks, an error detecting device, and a storing device for storing information relating to each possible block position of a sequence. The error detecting device includes a differential CRC-decoder including a first decoding device for decoding a sequence of blocks using a reference sequence to provide a reference syndrome and a second decoding device for decoding selected alternative differential blocks of the sequence obtainable via the error correcting device. The differential blocks are calculated as a difference between the corresponding block of the reference sequence and alternative blocks, respectively, to provide differential syndromes. The resulting syndromes are calculated as a sum of the reference syndrome and of a number of differential syndromes, respectively.

24 Claims, 7 Drawing Sheets

ARRANGEMENTS AND METHOD RELATING TO TRANSMISSION OF DIGITAL DATA

TECHNICAL FIELD

The present invention relates to arrangements, a system and a method within transmission of digital data. At transmission of information, e.g. data communications and wireless communications, errors are substantially always produced when signals are transferred over a channel from the transmitting side to the receiving side. Coding is often used as a protection against distorsion when data is transported over a channel. The present invention particularly relates to a receiving arrangement for receiving a digitally coded data signal transported over a channel. The invention also relates to a system for transferring digitally coded data signals over channels. Still further the invention relates to an error detecting arrangement, particularly a so called CRC (Cyclic Redundancy Check) decoder for detecting errors in a received CRC-coded data signal. The invention also relates to a method of detecting errors in a CRC-coded digital data signal.

One particular case when coding is used as a protection against distorsion is within mobile communications wherein a signal is transferred by radio between a base station and a mobile telephone. The longer the distance, the more the radio signal is attenuated and it also suffers from distorsion in the form of fading produced by interference, so called multiple fading, which means that a signal can take many different ways from one point to another in that it is reflected for example against buildings, etc.

In some digital mobile communication standards coding in two steps has been introduced in order to give an acceptable protection against loss of information. On the transmitting side an error detecting CRC-coder is introduced and as a second step an error correcting block coding device is introduced. A signal is supposed to comprise a number of sequences wherein each sequence is divided into a number of blocks, each of which blocks in turn comprises a number of bits. The error correcting device operates block-wise.

On the receiving side an error correcting decoder which decodes blocks of the total sequence forms a first step. In a second step an error detecting CRC-decoder is implemented to establish whether the error correcting decoder has made any erroneous decisions. The error detecting decoder operates on the entire sequence which, as referred to above, comprises a number of blocks. When the error detecting CRC-decoder detects that the decoded sequence is wrong, it is requested that the sequence be retransmitted. However, this may be very time consuming since several attempts may be necessary. Furthermore, signalling is required between the sending and the receiving side in order to administrate the retransmissions and this demands capacity which otherwise could have been used for useful transmission of information. What is needed is therefore a way to, as fast as possible, find the correct sequence and thus avoid, or at least reduce, retransmission. One known way of handling this problem is to make the error correcting block decoder provide a plurality of alternative suggestions which are tested by the error detecting decoder. The probability that one of the suggestions is correct will then be increased. It is, however, difficult to select candidates. The error correcting decoder is only capable of testing a limited number of alternative solutions. Furthermore, if too many alternatives are tested, the risk increases that an erroneous suggestion is accepted. Alternatives can be selected if each data bit has an attribute in the form of so called soft information, which is a measure on the probability that the chosen sign (zero or one) is correct. Candidates are selected through inverting bits with the lowest soft information, i.e. the bits which are the most likely to be wrong, are questioned first. One method of using soft information is the second algorithm of Chase. This is discussed in "A class of algorithms for decoding block codes with channel measurement information", IEEE Trans. Inform. Theory, vol. IT-18, pages 170–182, January., 1972, by D. Chase. In "Improved decoding of a concatenated code using soft decoding techniques", A Master of Science Thesis, dept. of Information Theory, Chalmers University of Technology, Gothenburg, Sweden, by M. Fahami and P. Flodin, December, 1995, the method has been further evaluated. Both these documents are herewith incorporated herein by reference. The soft information method consists in that a number of, for example M, alternatives are calculated for each block in the sequence. A number of blocks, N, are selected out of the total number of blocks. The N blocks should be the poorest blocks as far as this can be concluded, i.e. the blocks relating to which the uncertainty is the highest. The total sequence is then produced and consists of the permutations of the alternatives. Totally, there are thus $M^N$ alternative sequences to be tested. It should, however, be noted that there are a number of blocks that never have changed (the total sum minus N).

The error detecting CRC-decoder is applied in such a way that the total block decoded sequence is multiplied by the parity check matrix (H) of the CRC-polynomial. This can be realized as the sequence being shifted through a shift register, which e.g. may be implemented as hardware or as software. When the whole sequence has been shifted through the shift register, the content of the shift register is read out. This forms the syndrome of the decoding operation. If the syndrome only comprises zeros, the sequence is accepted, otherwise it is rejected. The CRC-coding can be defined through the original sequence being shifted through a shift register in which the cells have a starting position different from zero. In this manner the shifting operation is made non-linear.

This can, however, be seen as, starting from an initial state in which there are zeros in all cells, a preamble is shifted in which generates the defined starting state and then shifting in the sequence to be coded. On the decoding side this corresponds to the preamble being shifted in first followed by the sequence to be decoded. If a preamble is required, the parity check matrix is increased by as many rows as the preamble comprises. However, the number of the operations is high and, in addition thereto, many shifts are required and such operations are generally long and demanding operations, which in turn reduces the performance or requires much power. A consequence thereof may for example be that less alternatives than actually would be needed are tested.

SUMMARY OF THE INVENTION

What is needed is, therefore, a receiving arrangement for receiving a digitally coded data signal transported over a channel which includes means for error correction and detection, which only requires a limited number of advanced and demanding calculation operations in order to find a correctly transmitted sequence and which particularly requires fewer operations than hitherto known arrangements do. Particularly an arrangement is needed through which it is possible to save power and to lower the fabrication costs. An arrangement is also needed through which a high performance can be provided and through which a correctly transmitted signal efficiently can be found without requiring a high number of demanding operations, much power, etc.

A system for transferring digitally coded data signals over channels from a transmitting side to a receiving side is also needed, through which the above mentioned objects are achieved, i.e. wherein a correctly sent sequence easily and quickly can be found and in which as few retransmissions as possible are needed. An error detecting CRC-decoder for detecting errors in a received CRC-coded digital data signal which has been decoded in error correcting means is also needed, through which the above mentioned objects can be achieved.

Still further, a method of detecting errors in a CRC-coded digital data signal sequence is also needed, through which the detection can be performed fast and in an efficient and reliable manner and requiring as few long and complicated calculation operations as possible, and through which the performance can be kept at a high level. Still further, a method is needed through which the above mentioned objects are achieved and which is cost effective.

Therefore, a receiving arrangement as referred to above is provided which comprises error detecting means and storing means for storing information relating to the possible, different, block alternatives, wherein the error detecting means comprises a differential CRC-decoder. Said differential decoder includes first decoding means for decoding a sequence of blocks using a reference sequence to provide a reference syndrome. The second decoding means is used for decoding selected, alternative, differential blocks of the sequence, which alternatives are obtainable via the error correcting means. The differential blocks are calculated as the difference between the corresponding block of the reference sequence and each alternative block respectively, to provide differential syndromes. Then the sum of the reference syndrome and the respective differential syndrome is taken to provide resulting syndromes. The respective resulting syndromes are used to establish whether an alternative is correctly received or not.

Particularly, the reference syndromes are calculated through multiplying the reference sequence by a parity check matrix of the CRC-polynomial and the differential blocks are calculated as the difference (modulo 2) of the block of the reference sequence and the respective selected block alternatives. In a particular implementation the differential syndromes are generated through multiplication of the differential blocks by the corresponding part of the parity check matrix of the CRC-polynomial.

In a particular, advantageous, implementation the first decoding means comprises a first shift register and the reference syndrome is calculated through shifting the reference sequence once through said first shift register. Particularly, the second decoding means comprises a second shift register with parameters that can be loaded with values tabulated in the storing means for different positions according to the different alternatives and the differential blocks are shifted through said second shift register to provide the differential syndromes. Particularly, for a sequence comprising K blocks, of which N blocks are selected to have M alternatives, the number of calculation operations are K shifts to provide the reference syndrome, Nx (M−1) shifts to calculate the differential syndromes and $M^N$ additions (modulo 2) to calculate the resulting syndromes. The first and second decoding means may be implemented as hardware or software according to different embodiments. Particularly, the second shift register is used differently for each block position, which is a result of the above statements, and it provides for forward feeding as well as backward feeding of data, the coefficients of the CRC-polynomial being used for backward feeding and individual vectors of the H-matrix of the CRC-polynomial being used for forward feeding. Particularly, given rows of the H-matrix are stored in the storing means, e.g. a table, and the rows are given by how the original sequence is divided into blocks.

Therefore, also a system as referred to above is provided, which includes a number of transmitting arrangements and a number of receiving arrangements, which transmitting arrangements comprise error detecting CRC-coding means and error correcting block coding means through which a signal is transmitted to a receiving arrangement including error correcting means finding a number of block alternatives of a sequence which alternatives are provided to error detecting CRC-decoding means. The error detecting CRC-decoding means consists of a differential CRC-decoder including first and second decoding means. Furthermore, storing means are provided. The first decoding means are used for decoding a sequence of blocks using a reference sequence to provide a reference syndrome, whereas the second decoding means are used for decoding alternative differential blocks of the original sequence input to the receiving means. The alternatives are provided by the error detecting means and information about the different alternatives is contained in the storing means. The differential blocks are calculated using the second decoding means as the difference between the corresponding block of the reference sequence and each respective alternative block and the respective differential syndromes are provided for by multiplication by the appropriate parts of the parity check matrix of the CRC-polynomial. Resulting syndromes are calculated as the sum (modulo 2) of the reference syndrome and the respective differential syndromes.

Thus, the reference syndrome is calculated through multiplying the reference sequence by a parity check matrix of the CRC-polynomial and the differential syndromes are calculated as the difference (modulo 2) of the block of the reference sequence and the respective selected block alternatives multiplied by the relevant rows of the parity check matrix. Particularly, the first decoding means comprises a first shift register and the reference syndromes are calculated through shifting the reference sequence once through said first shift register. The second decoding means particularly is implemented as a second shift register with loadable parameters which are given values which are tabulated in the storing means for different positions according to the different alternatives as provided by the error correcting means. Differential blocks are then shifted through the second shift register to provide the differential syndrome.

Therefore, an error detecting arrangement is also provided, which comprises a CRC-decoder. According to the invention the CRC-decoder is differential and comprises first decoding means, second decoding means and storing means, as already discussed above.

Further yet, a method of detecting errors in a CRC-coded digital signal is provided. The method includes the steps of dividing the data signal sequence into blocks each comprising a number of bits; decoding blocks of the sequence in an error correcting decoder and the error correcting decoder providing a number of block alternatives to error detecting means. The method further includes the steps of: providing information, e.g. parameter values, relating to the block alternatives to storing means; storing information about said alternatives in said storing means; providing the alternatives to a differential error detecting decoder; using a reference sequence in first decoding means of the differential decoder to provide a reference syndrome; decoding differential alternative blocks using the block alternatives and information relating thereto contained in the storing means by calculating the difference between the reference block and the respective differential blocks to provide differential syndromes; adding a number (between 1 and N) of differential syndrome(s) (not two from the same block position) to the reference syndrome to obtain a number of resulting syndromes respectively; and, if the value of a respective resulting syndrome is zero, a block alternative is accepted. Particularly advantageous embodiments or alternatives are given by the subclaims.

It is an advantage of the invention that the number of long and complicated calculations are considerably reduced and to a great extent replaced by shorter and simpler calculative operations. It is particularly an advantage of the invention that a high performance can be provided and in that the sufficient number of alternatives easily can be tested, thus providing a reliable arrangement/method. It is a particular advantage of the invention that through the simplification of the calculative operations, power can be saved and in a particular embodiment may for example the number DSPs (Digital Signal Processor) that are needed, be reduced.

BRIEF DESCRIPTION OF THE DRAWINGS

The invention will in the following be further described in a non-limiting way and with reference to the accompanying drawings, in which:

FIG. 5 illustrates an example of a sequence comprising five blocks for three of which blocks different alternatives are given, wherein

DETAILED DESCRIPTION OF THE INVENTION

Figure 1A:
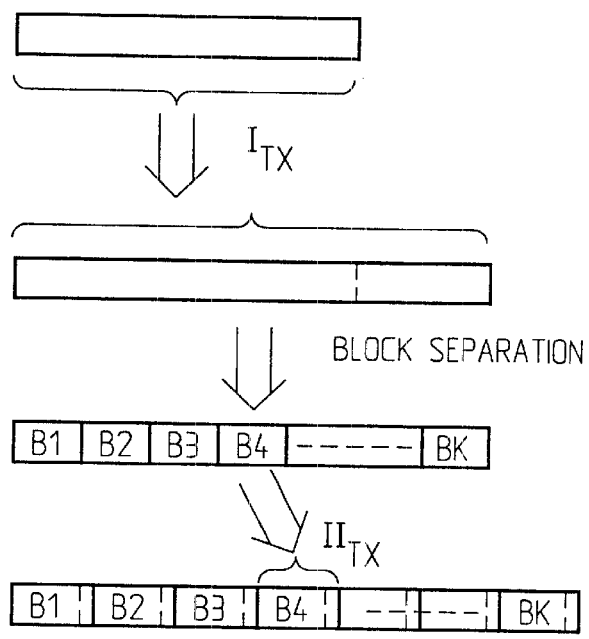
FIG. 1A very schematically illustrates how error correcting and detecting means operate on a sequence on the transmitting side, FIG. 1B very schematically, as in FIG 1A, illustrates how the error correcting and detecting means operate on a sequence on the receiving side, FIG. 2 schematically illustrates CRC-coding means that can be used for the coding procedure, FIG. 3 schematically illustrates the first CRC-decoding means for the decoding procedure of the reference sequence according to the invention.
Figure 1B:
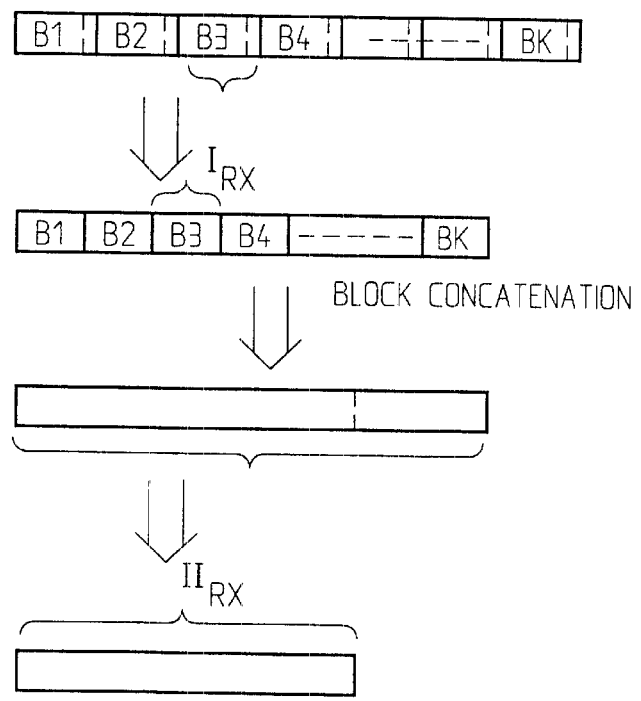

FIGS. 1A and 1B very schematically illustrate the principle of coding/decoding in two steps, respectively. On the transmitting side, as schematically illustrated in FIG. 1A, error detection coding means $I_{TX}$ are first implemented, which operate on the entire sequence. In FIG. 1A the uncoded sequence is first illustrated; then is illustrated how bits are added at the end (here) for coding purposes; the added bits are indicated to follow after the dashed line. Then a separation into K blocks (bits Bl–BK) is performed. Thereafter, in a second step, an error correction coding means $II_{TX}$ is implemented, which applies error correction coding blockwise; c.f. the bottom row of FIG. 1A which indicates bits added at the end of each block.

FIG. 1B in a corresponding manner shows the principle on the receiving side when an error correcting decoder $I_{RX}$ first decodes blocks of the total sequence. In the second step the error detecting CRC-decoder $II_{RX}$ is applied to check whether the error correcting decoder has made an erroneous decision. As illustrated in the figure, the error detecting decoder operates on the entire sequence. FIG. 1B separately illustrates the block concatenation.

According to the invention a differential CRC-decoder (CRC-coding as such will be briefly explained below) is provided which operates on a sequence of for example K blocks, of which N blocks have M different alternatives, whereas the other blocks only have one alternative. According to the invention the whole sequence does not have to be multiplied by the parity check matrix H (e.g. shifted through a shift register) for $M^N$ alternatives. Instead, the first alternative, the reference alternative, is shifted once through the shift register (in case shift registers are used, which, however relates to an advantageous implementation) whereupon a reference syndrome is calculated as:

$$S_0 = [\, p \;\; b_{10} \;\; b_{20} \;\; \ldots \;\; b_{k0} \;\; \ldots \;\; b_{(K-1)0} \;\; b_{K0} \,] \begin{array}{c} H_p \\ H_{b1} \\ H_{b2} \\ \ldots \\ H_{bk} \\ \ldots \\ H_{b(k-1)} \\ H_{bk} \end{array}$$

wherein the dimensions of the matrices are the following: s (which is a syndrome) has the dimension 1×m, m being the order of the CRC-polynomial, p (preamble) has the dimension 1×m, $b_x$. (referring to block x) has the dimension 1×n, n being the length of a decoded block, $H_p$ has the dimension m×m, wherein m is the order of the CRC-polynomial as referred to above, and $H_{bx}$ has the dimension n×m, n being the length of a decoded block as also referred to above.

In addition thereto the linear properties of the code are used in such a way that differential blocks are calculated as the difference (modulo 2) of the block included in the reference alternative and the respective block alternatives. Differential syndromes are provided in that the differential blocks are multiplied by the corresponding part of the parity check matrix as:

$$\Delta S_k = [0 \;\; 0 \;\; 0 \;\; \ldots \;\; \Delta b_k \;\; \ldots \;\; 0 \;\; 0\,] \begin{array}{c} H_p \\ H_{b1} \\ H_{b2} \\ \ldots \\ H_{bk} \\ \ldots \\ H_{b(n-1)} \\ H_{bn} \end{array} = \Delta b_k H_{bk}$$

In a particular embodiment this is implemented through shifting the differential blocks through shift registers (the second shift register referred to above, which has parameters that can be set according to the content in storing means as will be further discussed below) to calculate differential syndromes. The new or the resulting syndrome is calculated as the sum (modulo 2) of the reference syndrom and the respective differential syndrome(s). If shift registers are used, the second shift register is "different" for different block positions and provides for feeding of data in both directions. The coefficients of the CRC-polynomial are used as coefficients for feeding back, whereas the coefficients for forward feeding consist of individual vectors of the parity check matrix. If an implementation using shift registers is applied, the second shift register providing differential block $b_k$ should have h-coefficients according to the lowermost row in $H_{bk}$. In this manner the shifting will be equivalent to the matrix multiplication.

Figure 2:
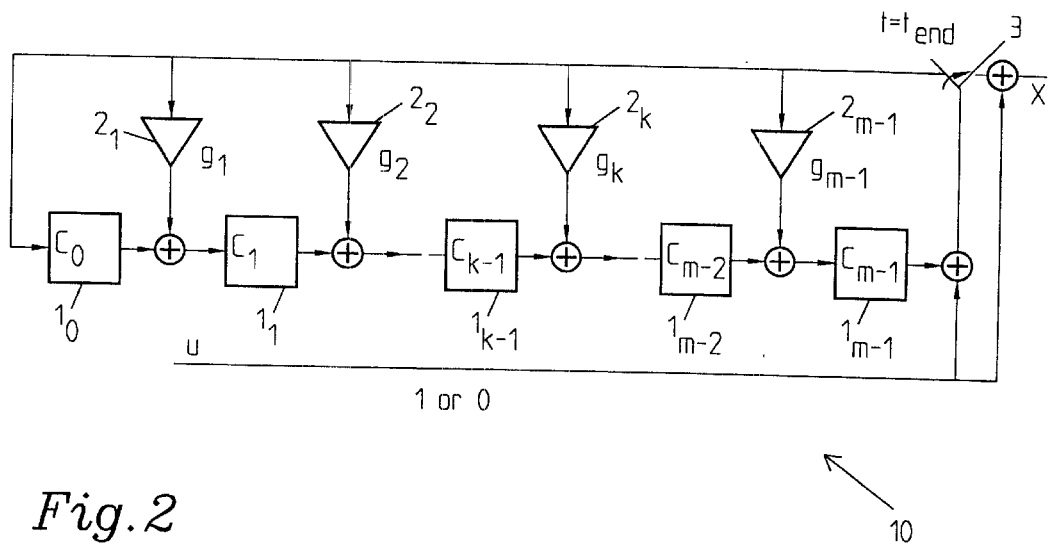

In the following the concept of CRC-coding/decoding will be briefly discussed. CRC-bits are used to detect whether a received unit could be the same as the unit sent. If not, the unit is rejected and it is requested the sending being repeated. The CRC-code is a block code with a generator polynomial $g(X)=1+x^5+x^{12}+x^{16}$. (This is only one example on a generator polynomial.) One way of realizing the coding is through using shift registers, c.f. the coding means 10 of FIG. 2. As a starting state the register only contains ones which, similarly to the generator polynomial, is specified in the ITU-T (formerly CCITT) code standard. (However, any starting state can be used and the invention is not limited to the standard.) The vector presentation g of $g(x)$ is [100010000001000]. Then the bits are shifted through and the registered bits are shifted out. The decoding is done by shifting the unit consisting of a number of bits through a similarly constructed register. If a preamble is implemented, it has to be shifted through the register first. This will be further discussed below, se also FIG. 3. If the decoding register after the shifting operations contains only zeros, the sequence is accepted and the bits are output. When the CRC-coding is performed on the transmitting side a sequence u is shifted through a shift register as described in FIG. 2. The initial state of the cells $c(c_0, c_1, \ldots, c_{k-1}, c_{m-2}, c_{m-1})$ is 1 in each cell. The factors g are defined by the CRC-generator polynomial $g(x)$, i.e. $g_5$ and $g_{12}$ equal 1, whereas all the others equal 0. The factor $g_0$ is 1 by definition and it is not written out in FIG. 2. Thus, the g factors are used in the multiplying means $2_1, 2_2, \ldots 2_{m-1}$. The CRC-code is a systematic block code, which means that the information bits are left unchanged, and the control bits are added at the beginning or at the end. As long as the information bits are shifted in, they are also fed to the output x. When all the information bits have been processed, a switch 3 is flipped over and the cell content is shifted out. The coded sequence x will then be $$x=[u_0 u_1 \ldots u_{end} c_{m-1} c_{m-2} \ldots c_0]$$

since $c_{m-1}$ is shifted out first and $c_o$ is shifted out last of the register state bits.

The block code with a generating polynomial will be described by a generator matrix G. The generator matrix of a systematic code coding k bits to n and adding the control bits at the end takes the expression:

$$G_{(k, n)}=[I_{(k, k)}|R_{(k, n-k)}]$$

where the indices are the sizes of the matrices and I is the identity matrix. In an implementation using shift registers, and if the shifting process shall be equivalent to a matrix multiplication, the starting states in each register cell must all be zero. Otherwise, the shifting process is not linear as the matrix multiplication is. In the CRC-coding means of FIG. 2 $g_i$ are the coefficients of the CRC-generator polynomial for $x_i$, u is the uncoded sequence and x is the coded sequence x comprises the original sequence u followed by the content of the cells when these are shifted out by switch 3 at $t=t_{end}$, which corresponds to the time when the whole sequence u has been shifted in.

CRC-decoding will now be briefly discussed. When a received sequence y is decoded, it is multiplied by the parity check matrix H. H is defined as:

$$H_{(n-k,n)}=[R^T_{(n-k,k)}|I_{(n-k,n-k)}]$$

wherein R is the same submatrix as in the generator polynomial G. The sequence y can be seen as the modulo-2 sum of the transmitted sequence x and an error vector the elements of which are 1 where an error has occurred and 0 elsewhere. The syndrome s is defined as:

$$s=[p\ y]\ H^T=([p\ x]\oplus e)H^T=[p\ x]H^T\oplus eH^T$$

wherein e is the error vector corresponding to [p x]. The bits in e corresponding to p (which is the preamble) are all zero.

The product $[p\ x]H^T$ can be written as:

$$[p\ \ x]H^T = [p\ \ u]GH^T$$
$$= [p\ \ u][I_{(k,k)}|R_{(k,n-k)}]\begin{matrix}R_{(k,n-k)}\\I_{(n-k,n-k)}\end{matrix}$$
$$= [p\ \ u](R_{(k,n-k)}\oplus R_{(k,n-k)})=0$$

and therefore $s=eH^T$.

Then, if all elements in e are 0, the syndrome is 0. If s differs from 0, there is at least one error in the detected sequence y.

The calculation of s can be performed in a shift register similar to the one used in the coding procedure.

Figure 3:
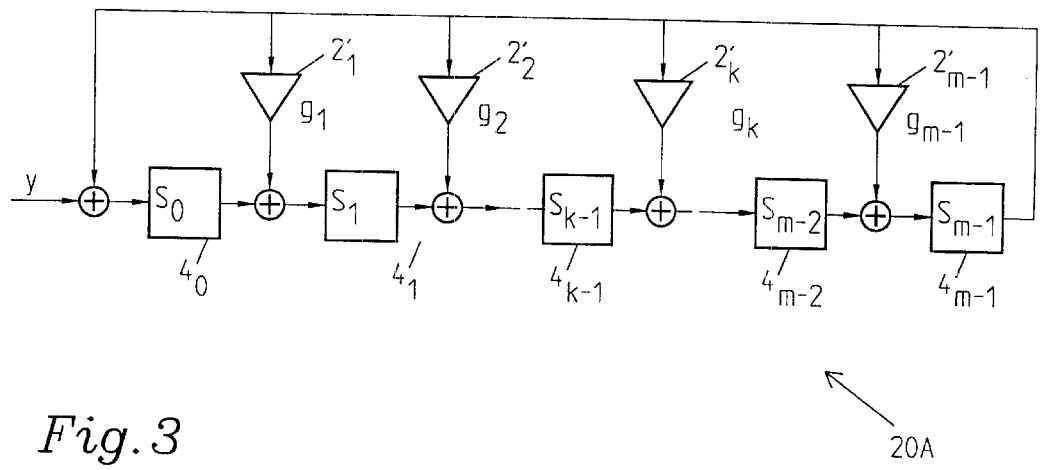

FIG. 3 shows the first decoding means 20A which are used for decoding of the reference sequence.

The factors g are the same as in the coding means, i. e. they represent the CRC-generator polynomial. The syndrome equals the state of the cells s after the shifting in of all bits in [p y]. The starting state bits should be all zeros. This is equivalent of using the p bits in reversed order as a starting state, and then shifting in the received y bits.

The connection between a matrix multiplication and a shifting procedure is that the rows in the matrix $H^T$ correspond to the states of the register when a single 1 and then only 0:s are shifted into an empty register. This sequence of states can be viewed as the impulse response of the register.

The last row in $H^T$ equals the first state of the impulse response, i. e. when the 1 is shifted in. This is because when the last bit in a sequence is shifted in, it will contribute to that state if it is a 1, compared to being a 0 bit. The final state in the register equals the modulo-2 sum of the states generated by the bits that are shifted in. The shifting operation is thus linear. So is the matrix multiplication, the product equals the modulo-2 sum of the rows in $H^T$ in positions corresponding to ones in the input vector.

The linear property can be used when many similar sequences y are analysed. If two sequences $Y_1$ and $Y_2$ of e. g. length 130 (which merely constitutes an example) and which only differ in some positions between $p_0$ and $(p_0+\Delta p-1)$ should be evaluated to see if any of them generates a zero syndrome, the evaluation of the second sequence can be done quickly by building a new shift register structure. The differential sequence is calculated as:

$$\Delta y_{k-1} = y_1 \oplus_2$$

and $$s_{y2} = [p \ \ y_2]H^T = [p \ \ y_1]H^T \oplus [0 \ \ \Delta y_{k-1}]H^T$$

$$= s_{y1} \oplus (\Delta w) H^T_{\text{rows } p0 \text{ to } (p0+\Delta p-1)} = s_{y1} \oplus \Delta s,$$

$\Delta w$ being the sequence in $\Delta y_{k-1}$ between $p_0$ and $(p_0+\Delta p-1)$. The first term, $S_{y1}$, has already been calculated using the shift register in FIG. 3. To calculate the second term, a matrix multiplication should be done. This operation only needs the rows $p_0$ to $(p_0+\Delta p-1)$ in $H^T$. Because only $\Delta p$ bits should be shifted into the register, it is unnecessary to use a structure which demands e. g. 130-$p_0$shifts to be performed to generate the state corresponding to row $p_0$. It would be convenient to use a register which have impulse response states corresponding to rows $p_0$ to $(p_0+\Delta p-1)$ in $H^T$.

Figure 4:
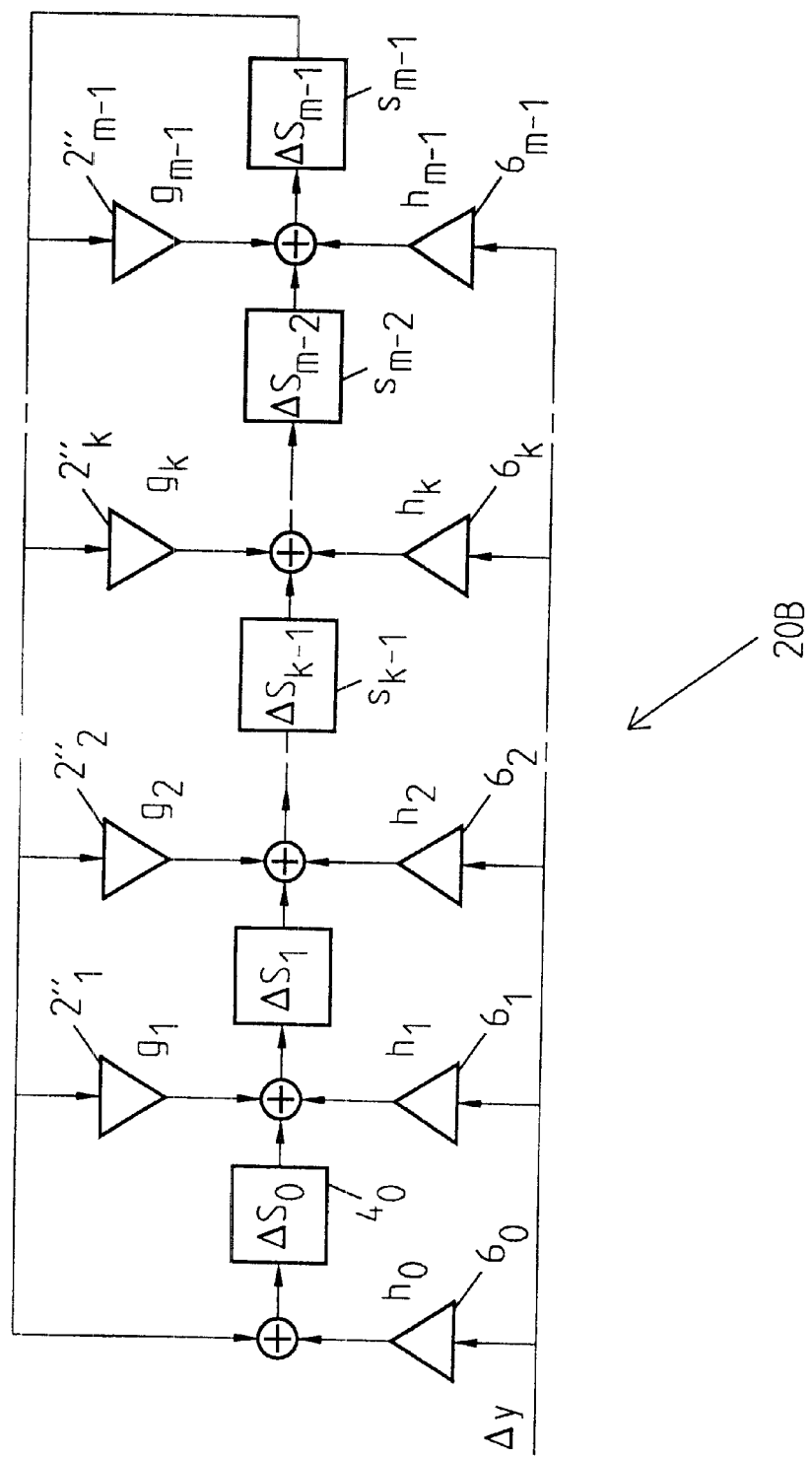
FIG. 4 illustrates the second CRC-decoding means for the decoding of a differential sequence according to the invention.

This can be achieved by using the second decoding means 20B in FIG. 4. The factors h ($h_0$–$h_{m-1}$) of the multiplying means $6_0, \ldots, 6_{m-1}$ correspond to the row $(p_0+\Delta p-1)$ in $H^T$. After shifting in the $\Delta w$ bits, the $\Delta s$ bits are read from the register state. Then, the syndrome of $y_2$ can be calculated as:

$$S_{y2} = S_{y1} \oplus \Delta s$$

If the $\Delta s$:s corresponding to N $\Delta w$:s are calculated, $2^N$ (provided there are only two different alternatives for the different positions) different y:s can be evaluated, i. e. their syndromes are calculated. In a generalized form it would be $M^N$, M being the number of alternatives.

The first decoding means 20A (as illustrated in FIG. 3) are, thus, a shift register decoder for a whole sequence. As referred to above, $g_i$ (of the multiplying means $2'_1, \ldots, 2'_{m-1}$) is 1 if the coefficient for $x_i$ of the CRC-polynomial is 1; 0 otherwise. In the illustrated example the CRC-polynomial is of grade m. y is the sequence that is fed in and $s_i$ contains, after the shifting has been completed, the syndrome for the reference sequence. As referred to above, the starting states $s_i$ for the cells $4_0, \ldots, 4_{m-1}$ of the decoding means 20B are all zeros. If the starting states $C_i$ for the cells $1_0, \ldots, 1_{m-1}$ of the coding means 10 differ from zero (due to the definition in the standard for the coding), y has to be preceded by a preamble. The length of the preamble is similar to the order m of the CRC-polynomial. The preamble is defined in such a way that if it is shifted into the coding register, which initially is set to zero, the defined starting state is to be generated.

FIG 4 thus illustrates the second decoding means 20B (which are differential) implemented as a shift register for a separate block. $g_i$ of multiplying means $2''_1, \ldots 2''_{m-1}$ corresponds to $g_i$ (of multiplying means $2'_1, \ldots 2'_{m-1}$) in FIG. 3, whereas $h_i$ is given by a row in the CRC-polynomial parity check matrix H, depending on blocks, as explained above. $\Delta y$ is the input differential block and $\Delta s_i$ contains, after the shifting has been completed, the corresponding differential syndrome. The starting position should again contain only zeros. The factors $h_i$ are stored in the storing means for each possible block position.

Figure 5:
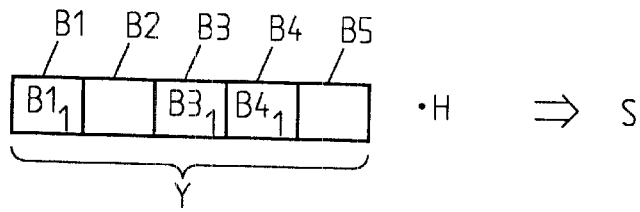

With reference to FIGS. 5, 5A–5E an embodiment will be exemplified in which a sequence consists of five blocks B1–B5. It is furthermore supposed that alternatives will be provided for three of said five blocks. FIG. 5 shows an example of a reference sequence Y with five blocks corresponding to block positions B1, B2, B3, B4, B5. The reference sequence is supposed to have a first alternative (index 1) in blocks 1, 3 and 4. The reference sequence Y is multiplied by the parity check matrix H to provide a check sum, here called S. As referred to above, this operation may be provided through shifting the reference sequence once through the first decoding means, i. e. the first shift register 10, once, in order to provide a reference syndrome S.

Figure 5A:
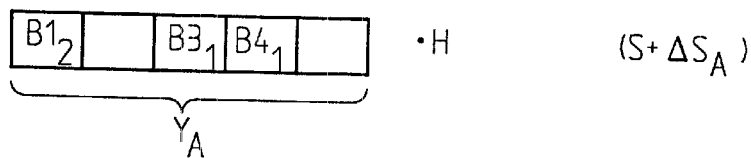
FIG 5A shows a first block alternative.
Figure 5A:
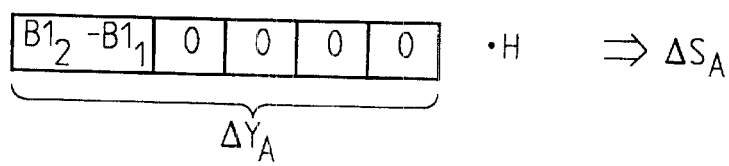

FIG. 5A shows an alternative sequence in which a second alternative is tried in block position B1, whereas in block positions B3 and B4 first alternatives corresponding to the alternatives of the reference alternative are maintained. Thus, the alternative sequence $Y_A$ also needs to be multiplied by the parity check matrix H. However, according to the invention this is done through the creation of a differential block $\Delta Y_A$ in which the difference between the alternative of block 1 and the reference alternative of the corresponding block is taken, i. e. illustrated through $B1_2 - B1_1$ in block position 1. In the other block positions are zeros. The differential syndrome $\Delta S_A$ is then created through multiplying the differential block $\Delta Y_A$ by the corresponding part of the parity check matrix H, as discussed above. Thus, the new (resulting) syndrome for the alternative $Y_A$ is given as the sum (modulo 2) of the reference syndrome S and the differential syndrome $\Delta S_A$.

Figure 5B:
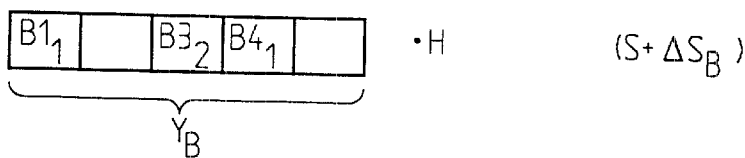
FIG. 5B shows a second alternative.
Figure 5B:
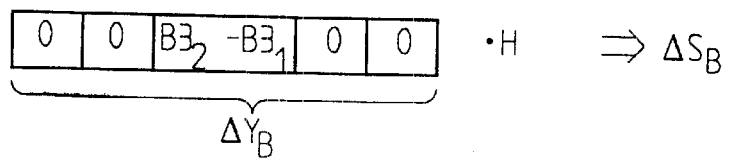

In FIG. 5B another alternative is tested in block B3, whereas blocks B1 and B4 are unchanged. This is indicated through reference $Y_B$ in which an index 2 is indicated in block B3 illustrating a second alternative for said block. In a manner similar to that as discussed with reference to FIG. 5A the differential sequence or a differential block is formed through taking the difference between the alternative of $Y_B$ and the reference alternative, i. e. $B3_2 - B3_1$ in block position 3. In the other block positions zeros are obtained. This gives a differential syndrome $\Delta S_B$ and the new (resulting) syndrome consists of the sum (modulo 2) of the reference syndrome and the differential syndrome $\Delta S_B$ as in FIG. 5A.

Figure 5C:
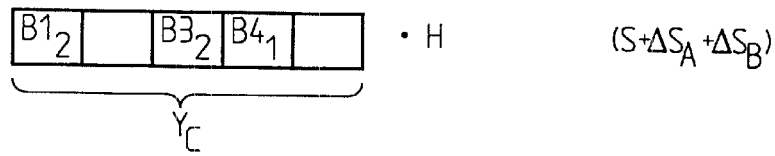
FIG. 5C shows a third alternative.

In FIG. 5C an alternative is illustrated, in which both in blocks B1 and B3 the second alternatives illustrated above are tested at the same time, whereas there is no change in block position B4 as compared to the reference alternative. This alternative is called $Y_C$ and in similarity to the preceding embodiments it needs to be multiplied by the parity check matrix H (part thereof). However, in this case both the alternative, in which a second alternative is used in block position B1 (corresponding to FIG. 5A), and the alternative, in which the second alternative is used in the third block position ($B3_2$) (corresponding to FIG. 5B), have already been calculated. Therefore, the resulting syndrome is obtained as the sum of the reference alternatives and the differential alternatives $\Delta S_A$ and $\Delta S_B$.

Figure 5D:
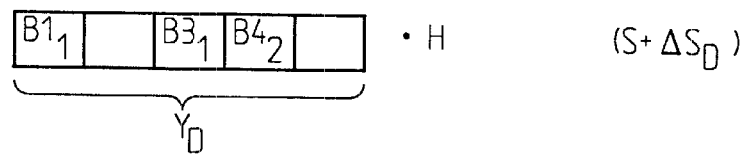
FIG. 5D shows a fourth alternative.
Figure 5D:
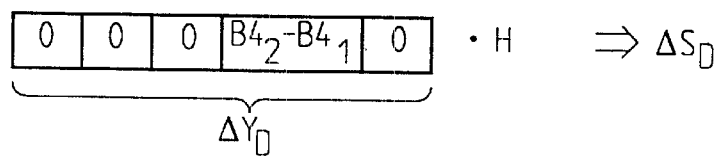

In FIG. 5D a second alternative in block position 4 will be tested corresponding to alternative $Y_D$. Again the differential block $B4_2 - B4_1$ in position B4 corresponding to $\Delta Y_D$ will be multiplied by the corresponding part of the H-matrix, and the new syndrome will be $S + \Delta S_D$.

Figure 5E:
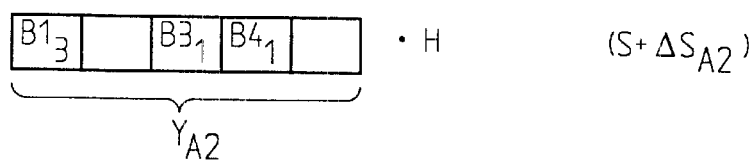
FIG 5E shows a fifth alternative.
Figure 5E:
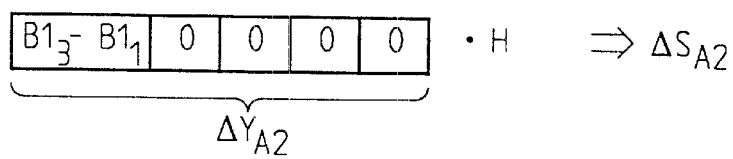

FIG. 5E relates to another situation, in which only one alternative is illustrated, corresponding to the case in which there are three alternatives for block position B1 and the third alternative (illustrated through index B3 in block position B1) is indicated. As before, the first alternatives are maintained in block positions B3 and B4. Again the differential sequence (or the differential block $B1_3 - B1_1$) is shifted through the relevant part of the parity check matrix H providing differential syndrome $\Delta S_{A2}$ and the new syndrome will be $S + \Delta S_{A2}$.

The operations providing the differential syndromes are, as referred to above, fast operations and the relevant parts of the parity check matrix, the h-coefficients, are stored in the storing means, e. g. a table, and the reference syndrome (calculated once) is used in the testing of each alternative.

Thus, it is sufficient that the long operation is done once, whereas the short operations are done three times provided that M=2. This means that eight different alternatives can be tested using additions (or XOR-operations) instead of nine long operations (corresponding to the operation that here is done once to provide the reference syndrome). Since the h-coefficients are stored in the storing means, the differential operations can be performed directly. If for three positions three alternatives are to be tested, 27 ($3^3$) alternatives can be tested and still only one long operation is needed. Furthermore six short shift operations are needed and 26 XOR-operations to calculate the different combinations.

Figure 6:
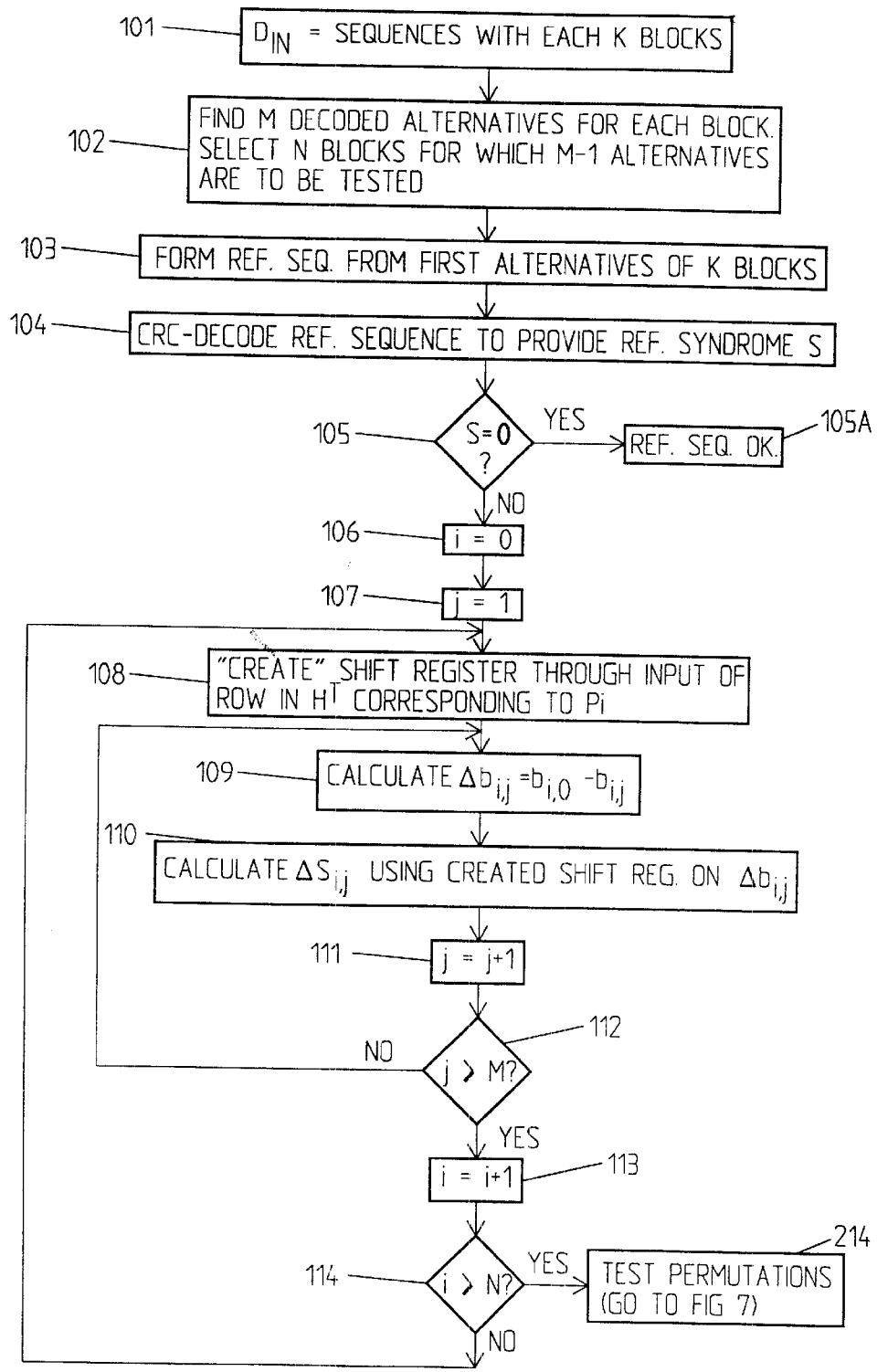
FIG. 6 is a flow diagram describing error detection on the receiving side according to the invention.

FIG. 6 is a flow diagram describing an implementation of the inventive concept. To an error correcting and detecting arrangement detected data $D_{IN}$, which comprises sequences each comprising K blocks, 101, is input. For each block M decoded alternatives are provided and N blocks are then selected for each of which the M−1 alternatives are to be tested, which corresponds to the error correcting decoding, 102. For the decoded blocks there are, thus, N positions each containing M alternatives and K-N positions with but one alternative. ($P_0, P_1, \ldots, P_{N-1}$ denote the positions for the N blocks having the highest number of alternatives).

A reference sequence is then composed of all K first alternatives, 103. Then the CRC-decoding, according to a standard method, is applied on the reference sequence having as a result a reference syndrome S, 104, cf. the description referring to FIG. 3. (The reference sequence may include a preamble if such an implementation is applicable; this is, however, not necessary).

Then it is examined, at step 105, whether the reference syndromes correspond to vector 0. If yes, the reference sequence is OK, 105A, and no further alternatives need to be tested. If, however, the reference syndrome is not equal to zero, i is set to zero, 106. j is equal to 1, 107, and a shift register is formed through inputting of the appropriate row of the $H^T$-matrix corresponding to position $P_i$, the h-coefficients being provided in storing means, 108. (This procedure was more thoroughly evaluated with reference to FIG. 4.) The differential block is obtained from the relationship $\Delta b_{ij}=b_{i,0}-b_{ij}$, 109. Then the differential syndrome $\Delta S_{i,j}$ is calculated using a customized created shift register decoder on $\Delta b_{ij}$, 1 10. Then j is increased by 1, 111, and it is checked whether i≧M, 112. If not, the next differential block, (j is increased by 1), is calculated and the procedure from 109 is repeated. If, however, j≧M, i is increased by 1, 113, and it is checked whether i≧N, 114. If yes, all ΔS are available and permutations should be tested, 214, which is further described in FIG. 7. Otherwise the procedure is repeated from 108.

Figure 7:
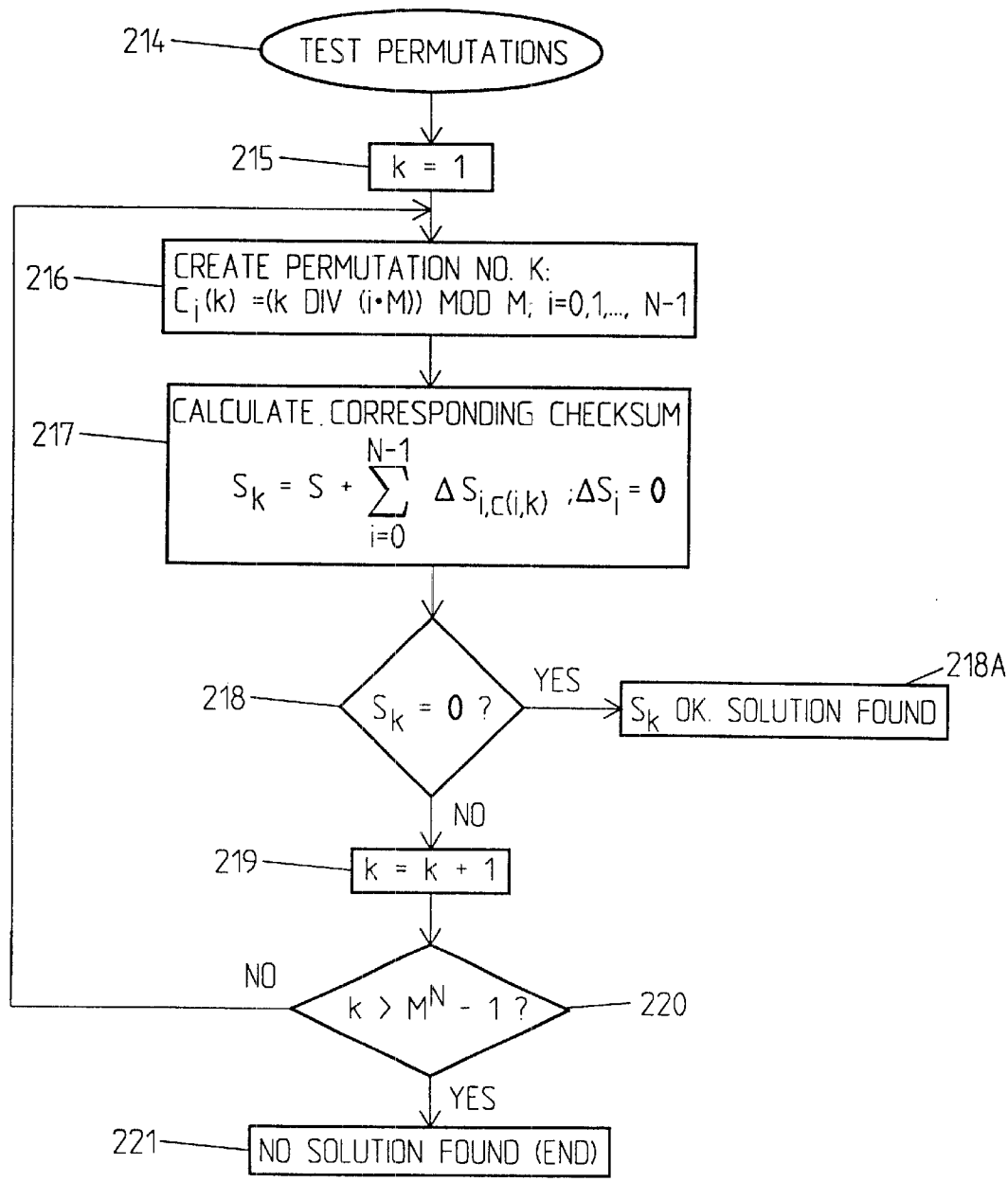
FIG. 7 is a flow diagram describing testing of permutations in a branch of the flow described in FIG. 6.

In FIG. 7 the permutations are tested, 214 (c.f. FIG. 6). The number of permutations are set to be $M^N-1$. As a start k is 1, 215, and permutation No. k is created as, 216:

$$C_i(k)=(k \text{ div}(i \cdot M))\bmod M; \; i=0, 1, \ldots, N-1.$$

Then the corresponding check sum $S_k$ is calculated according to $$S_k = S + \sum_{i=0}^{N-1} \Delta S_{i,c(i,k)}$$

the condition being that $\Delta S_{i,0}=0$ for each i, 217. Then it is examined whether $S_k=0$, 218. If yes, $S_k$ is in order and a solution has been found, 218A, and no further testing is required.

If $S_k$ is not equal to 0, k is increased by 1, 219, and it is examined, at step 220, whether k exceeds the number of permutations $M^N-1$. If not, permutation k+1 is formed, c.f. 216 above, and the procedure is repeated. If, however, k exceeds the number of permutations, all permutations have been examined and it is established that no solution was found, 221.

It should be clear that the invention is not limited to the illustrated embodiments, but that it can be varied in a number of ways without departing from the scope of the appended claims.

What is claimed is:

1. A receiving arrangement for receiving a digitally coded data signal transported over a channel, which data signal comprises a number of sequences, each sequence being divided into a number of blocks, each block in turn comprising a number of bits, said receiving arrangement comprising error correcting means providing a number of alternative blocks, error detecting means, and storing means for storing information relating to each possible block position of a sequence, said error detecting means comprising a differential CRC-decoder including first decoding means for decoding a sequence of blocks using a reference sequence to provide a reference syndrome and second decoding means for decoding selected alternative differential blocks of the sequence obtainable via the error correcting means, said differential blocks being calculated as the difference between the corresponding block of the reference sequence and each alternative block, respectively, to provide differential syndromes, resulting syndromes being calculated as the sum of the reference syndrome and a number of differential syndromes, respectively.

2. The receiving arrangement according to claim 1, wherein the reference syndrome is calculated through multiplying the reference sequence by a parity check matrix of a CRC-polynomial, and the differential blocks are calculated as the difference of the block of the reference sequence and the respective selected block alternative.

3. The receiving arrangement according to claim 2, wherein the differential syndromes are generated through multiplication of the differential blocks by the corresponding part of the parity check matrix of the CRC-decoder.

4. The receiving arrangement according to claim 1, wherein the first decoding means comprises a first shift register, and the reference syndrome is calculated through shifting the reference sequence once through the first shift register.

5. The receiving arrangement according to claim 4, wherein the second decoding means comprises a second shift register with loadable parameters tabulated for different positions according to the different positions/alternatives, and differential blocks are shifted through said second shift register to provide the differential syndromes.

6. The receiving arrangement according to claim 4, wherein for a sequence comprising K blocks, of which N blocks are selected to have M alternatives each, using the error correcting means, the number of calculation operations are K shift operations to calculate the reference syndrome, N×(M−1) shift operations to calculate the differential syndromes, and $M^N$ additions to calculate the resulting syndromes.

7. The receiving arrangement according to claim 4, wherein the second shift register is used differently for each block position and provides for forward feeding as well as backward feeding of data, the coefficients of a CRC-polynomial being used for backward feeding and individual vectors of the H-matrix of the CRC-polynomial being used for forward feeding.

8. The receiving arrangement according to claim 1, wherein the first and second decoding means are implemented as hardware.

9. The receiving arrangement according to claim 1, wherein the first and second decoding means are implemented as software.

10. The receiving arrangement according to claim 1, wherein in the storing means, given rows of an H-matrix are stored, the given rows being determined by how the sequence is divided into blocks.

11. The receiving arrangement according to claim 1, wherein the storing means comprises a table in which h-coefficients of an H-matrix for different block alternatives are stored.

12. A system for transferring digitally coded data signals transported over channels, which data signals comprise sequences which are divided into blocks, each of said blocks comprising a number of data bits, the system comprising a number of transmitting arrangements and a number of receiving arrangements, wherein each of said transmitting arrangements comprises error detection CRC-coding means and error correcting block coding means through which a signal is transmitted to a receiving arrangement including error correcting means finding a number of block alternatives of a sequence provided to error detection CRC-decoding means, wherein said error detection means comprises a differential CRC-decoder, storing means are provided for storing information relating to each possible block position of a block, said differential CRC-decoder includes first decoding means for decoding a sequence of blocks using a reference sequence to provide a reference syndrome and second decoding means for decoding selected alternative differential blocks of the sequence obtainable via the error correcting means using information from the storing means, said differential blocks are calculated as the difference between the corresponding block of the reference sequence and each alternative block, respectively, to provide differential syndromes, and for each alternative, resulting syndromes are calculated as the sum of the reference syndrome and a number of differential syndromes and if the value of a resulting syndrome is zero, the received sequence alternative is correct, otherwise it is erroneous.

13. A system according to claim 12, wherein the reference syndrome is calculated through multiplying the reference sequence by a parity check matrix of the CRC-polynomial, the differential block alternatives are calculated as the difference of the block of the reference sequence and the respective selected block alternatives, and the differential syndromes are generated through multiplication of the differential block alternatives by the corresponding part of the parity check matrix of the CRC-decoder.

14. A system according to claim 12, wherein the first decoding means comprises a first shift register, the reference syndromes are calculated through shifting the reference sequence once through the first shift register, the second decoding means comprises a second shift register with loadable parameters which are tabulated for different positions according to information contained in the storing means, and differential blocks are shifted through said second shift register to provide the respective differential syndromes.

15. A system according to claim 12, wherein for an input sequence comprising K-blocks, of which N blocks are selected to have M alternatives provided by the error correcting means, the number of calculation operations are $K+(M-1)\times N$ shifts to provide the reference syndrome and the differential syndromes and $M^N$ additions to calculate the resulting syndromes.

16. An error detecting CRC-decoder for detecting errors in a received CRC-coded digital data sequence, which sequence is divided into a number of blocks, each comprising a number of bits, and which signal is decoded in error correcting means providing a number of block alternatives, wherein the error detecting CRC-decoder is differential, storing means are provided for storing information relating to each possible block position of a sequence, the differential CRC-decoder includes first decoding means for decoding a sequence of blocks using a reference sequence to provide a reference syndrome and second decoding means for decoding selected alternative differential blocks of the sequence obtainable from the error correcting means, the differential blocks are calculated as the difference between the corresponding block of the reference sequence and each alternative block, respectively, to provide differential syndromes, and a resulting syndrome is calculated for each alternative as the sum of the reference syndrome and the respective differential syndrome(s).

17. An error detecting CRC-decoder according to claim 16, wherein the reference syndrome is calculated through multiplying the reference sequence by a parity check matrix of the CRC-polynomial, the differential blocks are calculated as the difference of the block of the reference sequence and the respective selected block alternatives, and the differential syndromes are generated through multiplication of the differential blocks by the corresponding part of the parity check matrix of the CRC-decoder.

18. An error detecting CRC-decoder according to claim 16, wherein the first decoding means comprises a first shift register, the reference syndromes being calculated through shifting the reference sequence once through said first shift register, the second decoding means comprises a second shift register with loadable parameters tabulated in the storing means for different positions, and the differential blocks are shifted through said second shift register to provide the respective differential syndromes.

19. An error detecting CRC-decoder according to claim 16, wherein for a sequence comprising K blocks, of which N blocks are selected to have M alternatives according to the error correcting means, the number of calculation operations are $K+(M-1)\times N$ shifts to provide the reference syndrome and the differential syndromes and $M^N$ additions to calculate the resulting syndromes.

20. A method of detecting errors in a CRC-coded digital signal sequence, comprising the steps of:
- dividing the digital sequence into blocks, each comprising a number of bits,
- decoding blocks of the sequence in an error correcting decoder which outputs a number of block alternatives for a number of block positions,
- providing information about the block alternatives to storing means,
- storing the information in said storing means,
- providing the block alternatives to a differential decoder,
- in first decoding means of the differential decoder using a reference sequence to provide a reference syndrome,
- decoding differential alternative blocks using information relating to the respective blocks in the storing means to calculate the difference between the corresponding block of the reference sequence and the respective block alternative to provide a differential syndrome for each block alternative,
- calculating resulting syndromes for each block alternative as the respective sums of the reference syndrome and the respective differential syndrome(s), and accepting an alternative if the value of the respective syndrome is zero.

21. A method according to claim 20, further comprising the steps of:

multiplying the reference sequence by a parity check matrix of the CRC-polynomial thus providing a reference syndrome, calculating the difference of the block of the reference sequence corresponding to a selected block alternative and said respective selected block alternative to provide a differential syndrome, and repeating the calculation of differential syndromes for a number of alternatives.

22. A method according to claim 21, further comprising the step of:

generating differential syndromes through multiplying the differential blocks by the respective corresponding part of the parity check matrix of the CRC-decoder.

23. A method according to claim 20, further comprising:

calculating the reference syndrome through shifting the reference sequence once through a first shift register, and calculating a number of differential syndromes through shifting a number of differential blocks through a second shift register containing loadable parameters which are tabulated in storing means for different positions according to different block alternatives.

24. A method according to claim 20, further comprising the steps of, for a sequence comprising K blocks, of which N blocks are selected to have M alternatives, performing $K+(M-1)\times N$ shifts to provide a reference syndrome and differential syndromes, and performing $M^N$ additions to calculate resulting syndromes.

* * * * *